(12) United States Patent
Pfaffinger et al.

(10) Patent No.: US 10,750,650 B2
(45) Date of Patent: Aug. 18, 2020

(54) METHOD AND APPARATUS FOR ASSIGNING ASSEMBLIES TO COMPONENT FITTING LINES

(71) Applicant: SIEMENS AKTIENGESELLSCHAFT, München (DE)

(72) Inventors: Alexander Pfaffinger, München (DE); Christian Royer, Ottobrunn (DE)

(73) Assignee: SIEMENS AKTIENGESELLSCHAFT (DE)

( * ) Notice: Subject to any disclaimer, the term of this patent is extended or adjusted under 35 U.S.C. 154(b) by 14 days.

(21) Appl. No.: 16/078,190

(22) PCT Filed: Mar. 10, 2016

(86) PCT No.: PCT/EP2016/055138
§ 371 (c)(1),
(2) Date: Aug. 21, 2018

(87) PCT Pub. No.: WO2017/152979
PCT Pub. Date: Sep. 14, 2017

(65) Prior Publication Data
US 2019/0069455 A1 Feb. 28, 2019

(51) Int. Cl.
*G05B 19/418* (2006.01)
*H05K 13/08* (2006.01)

(52) U.S. Cl.
CPC ..... *H05K 13/085* (2018.08); *G05B 19/41865* (2013.01); *G05B 2219/40111* (2013.01); *G05B 2219/50148* (2013.01)

(58) Field of Classification Search
CPC .............................................. G05B 19/41875
(Continued)

(56) References Cited

U.S. PATENT DOCUMENTS 5,258,915 A * 11/1993 Billington .............. G06Q 10/04
700/103
6,829,514 B2 12/2004 Gyorfi et al.
(Continued)

FOREIGN PATENT DOCUMENTS

DE 3633478 A1 * 3/1988 ............. H05K 13/02
DE 19834620 A1 3/1999
(Continued)

OTHER PUBLICATIONS

ASM Assembly Systems, http://www.siplace.com/en/Home, Mar. 10, 2016.
(Continued)

*Primary Examiner* — Suresh Suryawanshi
(74) *Attorney, Agent, or Firm* — Schmeiser, Olsen & Watts LLP

(57) ABSTRACT

Provided is a method for allocating assemblies to placement lines for placing components on the assemblies, in order to achieve a minimum variation in components with a predefinable maximum capacity utilization in terms of time for each placement line, wherein the component variation is determined as the sum of the number of component types required on the placement lines and an expected production time is determined for each assembly type of the assemblies to be provided with components and for each placement line, taking into consideration each cycle time for the assembly type on the placement line, each reset time, the degree of utilization for each line and the expected number of pieces to be produced for each assembly type.

18 Claims, 2 Drawing Sheets

(58) Field of Classification Search
USPC .......................................................... 700/100
See application file for complete search history.

(56) References Cited

U.S. PATENT DOCUMENTS

| | | | |
|---|---|---|---|
| 9,134,724 B2* | 9/2015 | Saulsbury | G05B 19/41805 |
| 10,197,995 B2* | 2/2019 | Groth | G05B 19/41865 |
| 2013/0316551 A1* | 11/2013 | Day, Jr. | H05K 13/04 |
| | | | 439/84 |
| 2015/0102170 A1* | 4/2015 | Koncz | B64F 5/10 |
| | | | 244/131 |
| 2015/0135505 A1* | 5/2015 | Royer | H05K 13/08 |
| | | | 29/428 |
| 2015/0160648 A1* | 6/2015 | Craiovan | G05B 19/418 |
| | | | 700/121 |
| 2015/0195965 A1* | 7/2015 | Craiovan | H05K 13/08 |
| | | | 29/593 |
| 2015/0195966 A1* | 7/2015 | Pfaffinger | H05K 13/08 |
| | | | 700/121 |
| 2018/0049315 A1* | 2/2018 | Mueller | H05K 1/0269 |

FOREIGN PATENT DOCUMENTS

| | | |
|---|---|---|
| DE | 102008020167 A1 | 7/2009 |
| DE | 102011076565 B4 | 6/2014 |
| EP | 2894528 A1 | 7/2015 |
| JP | 2014123272 A | 7/2014 |
| JP | WO2015121927 A1 | 3/2017 |
| WO | WO 2014005741 A1 | 1/2014 |
| WO | WO 2014005743 A1 | 1/2014 |
| WO | WO 2014005744 A1 | 1/2014 |

OTHER PUBLICATIONS

International Search Report for PCT/EP2016/055138.
Zhang Hong-wei.; "The Application on Surface Mount Technology( SMT) in the Laboratory" Journal of Nanyang Teachers College (Natural Siences Edition); vol. 2 No.: ; Mar. 2003.
Method for SMT passive components.
Non-English Chinese Office Action dated Nov. 5, 2019 for Application No. 201680083350.6.
Japanese Office Action dated Feb. 4, 2020 for Application No. 2018-548006.

* cited by examiner

METHOD AND APPARATUS FOR ASSIGNING ASSEMBLIES TO COMPONENT FITTING LINES

CROSS-REFERENCE TO RELATED APPLICATIONS

This application claims priority to PCT Application No. PCT/EP2016/055138, having a filing date of Mar. 10, 2016, the entire contents of which are hereby incorporated by reference.

FIELD OF TECHNOLOGY

The following relates to a method for assigning assemblies to component fitting lines for fitting the assemblies with components. Additionally, the following relates to an apparatus for a production or assembly line for fitting assemblies with components. Moreover, the following relates to a computer program product (non-transitory computer readable storage medium having instructions, which when executed by a processor, perform actions) and a computer-readable medium.

BACKGROUND

In particular in the field of electronics production, printed circuit boards or assemblies to be produced are manufactured on SMT component fitting lines by means of surface mounting (surface mounted technology, SMT). A manufacturer of SMT component fitting machines and systems with the product name SIPLACE is the ASM company (http://www.siplace.com/en/Home), for example.

On account of technical restrictions, not every assembly can be produced on every component fitting line, however. The assemblies for the most part also have different production times on the component fitting lines. Also, the maximum production time capacities of the component fitting lines cannot be exceeded.

The assignment of assemblies to component fitting lines of a component fitting system is usually made manually or semiautomatically, based on empirical values or heuristics.

Since the planning horizon during production is for the most part medium-term, there are uncertainties with regard to the future numbers of items of the different assembly types. This can lead to undesirably large fluctuations in the utilization levels/production times of the component fitting lines. Therefore, it is desirable in practice to avoid assembly line assignments that mean that particularly high production time fluctuations can arise for individual lines. This can result in the applicable lines often running above capacity or below capacity.

In the case of one possible use of mathematical optimization methods, linear optimization methods are possible. Linear optimization is concerned with the optimization of linear target functions over a set limited by linear equations and in equations. It is the basis of the solution methods of (mixed) integer linear optimization. What is known as a solver is a group designation for specific mathematical computer programs that can solve mathematical problems numerically. In connection with MIP (mixed integer linear programming), standard solvers such as e.g. CPLEX or Gurobi can be used for small IP programs (integer optimization models). Conceivable small IP programs are instances having two lines, 181 assemblies and 839 component types, for example. For larger instances, standard solvers such as CPLEX can give rise to problems for solving this more complex problem.

U.S. Pat. No. 6,829,514 B2 proposes using mixed integer linear programming during production for electronic assemblies to optimize individual production lines.

DE 198 34 620 A1 relates to a method for ascertaining an upgrade for a mix of different assembly types in a component fitting line.

DE 10 2011 076 565 B4, WO 2014/005741 A1, WO 2014/005743 A1 and WO 2014/005744 A1 disclose methods that are examples of optimization methods by means of MIP for assignments of assemblies to component fitting lines.

DE 10 2011 076 565 B4 especially discloses a method for assigning printed circuit boards to component fitting lines for fitting the printed circuit boards with components, which achieves the lowest possible component variance and the most optimum possible production time under prescribed constraints. In this case, the component variance is determined as a sum of the numbers of component types needed on the component fitting lines.

An equipment family is determined as a set of assemblies that can be fitted with components on a component fitting line without changing the set of component types kept on the component fitting line for component fitting. The set of component types kept on the component fitting line is also called equipment. Usually, a component fitting line has more assemblies assigned to it than an equipment family can comprise, since it is not possible for any number of component types to be kept on the component fitting line. The component fitting line is therefore occasionally subjected to a change of equipment, which involves the equipment for a first equipment family being changed for the equipment for a second equipment family. The rarer these equipment changes are, the less time consuming the operation of the component fitting system can be. The total number of equipment families used in the component fitting system may be a more realistic quality indicator than, by way of example, the component variance of a component fitting line. The component variance of a component fitting line is given by the number of different component types whose components are to be fitted to one of the assemblies assigned to the component fitting line. The method known from DE 10 2011 076 565 B4 can therefore determine assignments of assemblies to component fitting lines that allow an improved utilization level for the overall component fitting system.

In order to restrict maximum production time fluctuations for the individual lines or to minimize them as far as possible, further improvements are needed in the IP model.

To be able to obtain solutions for larger instances or more complex problems at all or even in optimized fashion, a good or precise selection of parameters in the IP model or IP program with the restrictions to be applied or the user-defined presets is fundamental.

SUMMARY

An aspect relates to an improved optimization method or technique for assigning assemblies to component fitting lines in comparison with the cited prior art.

The following claims a method for assigning assemblies (LP1-LP6) to component fitting lines (BL1-BL2) for fitting the assemblies (LP1-LP6) with components (B1-B6) in order to achieve a minimal component variance for prescribed maximum utilization levels over time per component fitting line (BL1-BL2), wherein the component variance is determined as the sum of the numbers of component types needed on the component fitting lines (BL1-BL2), wherein an expected production time is ascertained for each assembly type of the assemblies (LP1-LP6) to be fitted with components and each component fitting line (BL1-BL2) taking into consideration the respective cycle time for the assembly type on the component fitting line (BL1-BL2), the respective conversion times, the respective level of line use and the expected number of items to be produced per assembly type, wherein the actual number of items to be produced arises according to a previously determinable probability distribution, wherein the sum of these expected (total) production times must not exceed the maximum utilization level of the respective component fitting line (BL1-BL2) over time for the set of assemblies (LP1-LP6) that is assigned to a line (BL1-BL2), wherein the possible assignments of assemblies (LP1-LP6) to the component fitting lines (BL1-BL2) are limited by the existing infrastructure or by user-defined presets, wherein the assignment is made such that for the probability distributions for the sum of the expected production times per component fitting line that result from the cited probability distributions for the numbers of items, the differences from the respective expected value of these resultant probability distributions are limited by a prescribable maximum threshold value, wherein the assignment of the assemblies (LP1-LP6) to the component fitting lines (BL1-BL2) is computed for the given presets by means of integer linear programming.

An embodiment of the invention is the minimization of the sum of the differences from the respective expected value.

The advantage of the approach according to embodiments of the invention is that it is now also possible for problems with larger instances to be solved less computationally intensively than with heuristic approaches.

The optimization method applied can be what is known as integer linear programming. This allows commercial standard solvers to be used.

The cited differences from the expected values of the resultant probability distributions can assume similar or like values. In this context, similar can mean that a maximum difference at the top or bottom is permitted. "Like" in this context can mean identical. However, (almost) like values also result in slight inaccuracies in the form of minor differences at the top or bottom being possible, wherein, in contrast to "similar", a minor difference of this kind is barely plannable and therefore barely predeterminable.

It may be useful if user-prescribed sets of assemblies are assigned to the same component fitting line.

The difference from the sum of the expected production times of a component fitting line can be expressed as a variance thereof.

The variance per component fitting line can be determined by the sum of all assembly types assigned to the component fitting line from the product of the square of the difference from the expected number of items of an assembly type within a period and the associated values of the resultant probability distributions and multiplied by the square cycle time.

A development of embodiments of the invention provides for a weighted sum consisting of the component variance and the maximum difference from the sum of the expected production times to be minimized.

The input data used for the integer linear programming can be the following data describing the infrastructure:
number of component fitting lines,
number of assemblies,
number of assembly types,
number of component types,
set of component types to be fitted per assembly type,
production time limit per respective component fitting line,
probability distributions for the expected numbers of items of the assembly types.

The total production time for a respective assembly type on a respective component fitting line can be computed from:
the expected numbers of items,
the number of jobs to be expected,
the batch sizes,
the conversion times,
the individual production times per assembly and component fitting line,
minimum cycle times of the component fitting lines,
levels of use of the component fitting lines.

The linear programming can be set by means of an integer linear program that is solved by the following steps:
a) ascertaining a first current solution representing an assignment of assemblies to production lines,
b) assigning a selected set of assemblies to the component fitting lines, based on a current solution,
c) computing the new assignments by means of an optimization program or a standard solver based on integer linear programming.

The steps described above can be performed iteratively and a program termination takes place if a previously stipulated time limit or solution quality has been reached.

While the claimed method defines a first target function of the optimization method, the claimed method can additionally be augmented with a second target function that is supposed to converge toward the best possible result for the differences from the respective expected value. The first target function is the component variance.

The user can manually prescribe whether the overall optimization with the two target functions is supposed to result in more weight being placed on the first target function or more weight being placed on the second target function.

A further aspect of embodiments of the invention provides an apparatus for assigning assemblies to component fitting lines for fitting the assemblies with components, having:
a unit for ascertaining an expected production time for each assembly type of the assemblies to be fitted with components and for each component fitting line taking into consideration the respective cycle time for the assembly type on the component fitting line and the expected number of items to be produced per assembly type, wherein the actual number of items to be produced can arise according to a previously determinable probability distribution, wherein the sum of these expected (total) production times must not exceed the maximum utilization level of the respective component fitting line over time for the set of assemblies that is assigned to a line, wherein the possible assignments of assemblies to component fitting lines can be limited by the existing infrastructure and/or by user-defined presets and wherein the component variance is determinable as the sum of the numbers of component types needed on the component fitting lines in order to achieve a minimum component variance for prescribed maximum utilization levels over time per component fitting line, and a unit for computing the assignment of the assemblies to the component fitting lines for the given presets by means of integer linear programming, wherein the computation of the assignment is effected such that for the probability distributions for the sum of the expected production times per component fitting line that result from the cited probability distributions for the numbers of items, the differences from the respective expected value of these resultant probability distributions are limitable by a prescribable maximum threshold value.

The apparatus can provide means and/or units or devices and/or modules for performing the method cited above that may each be fashioned in hardware and/or in firmware and/or in software or as a computer program or computer program product.

The apparatus can be configured or developed as appropriate like the method described above.

A further aspect of embodiments of the invention provides a production or assembly line arrangement for fitting assemblies with components, wherein the assignment of the assemblies to the production or assembly line is determinable according to the method explained above.

This production or assembly line arrangement may be part of an installation.

The installation may be characterized by one of the following installation types, inter alia. Examples of these are:
- an automation installation,
- a production installation,
- a cleaning installation,
- a water conditioning installation,
- an appliance or a machine,
- a turbomachine,
- a power generation installation,
- a power grid,
- a communication network,
- a medico-technical device or appliance,
- a hospital information system.

A further aspect of embodiments of the invention is a computer program product or a computer program having means for performing the aforementioned method when the computer program (product) is executed in an aforementioned apparatus or in means of the apparatus. The computer program or computer program product may be stored on a computer-readable medium. The computer program or computer program product may be written in a standard programming language (e.g. C++, Java). The processing device can comprise a commercially available computer or server having appropriate input, output and storage means. This processing device may be integrated in the apparatus or in the means thereof.

BRIEF DESCRIPTION

Some of the embodiments will be described in detail, with references to the following figures, wherein like designations denote like members, wherein.

DETAILED DESCRIPTION

Figure 1:
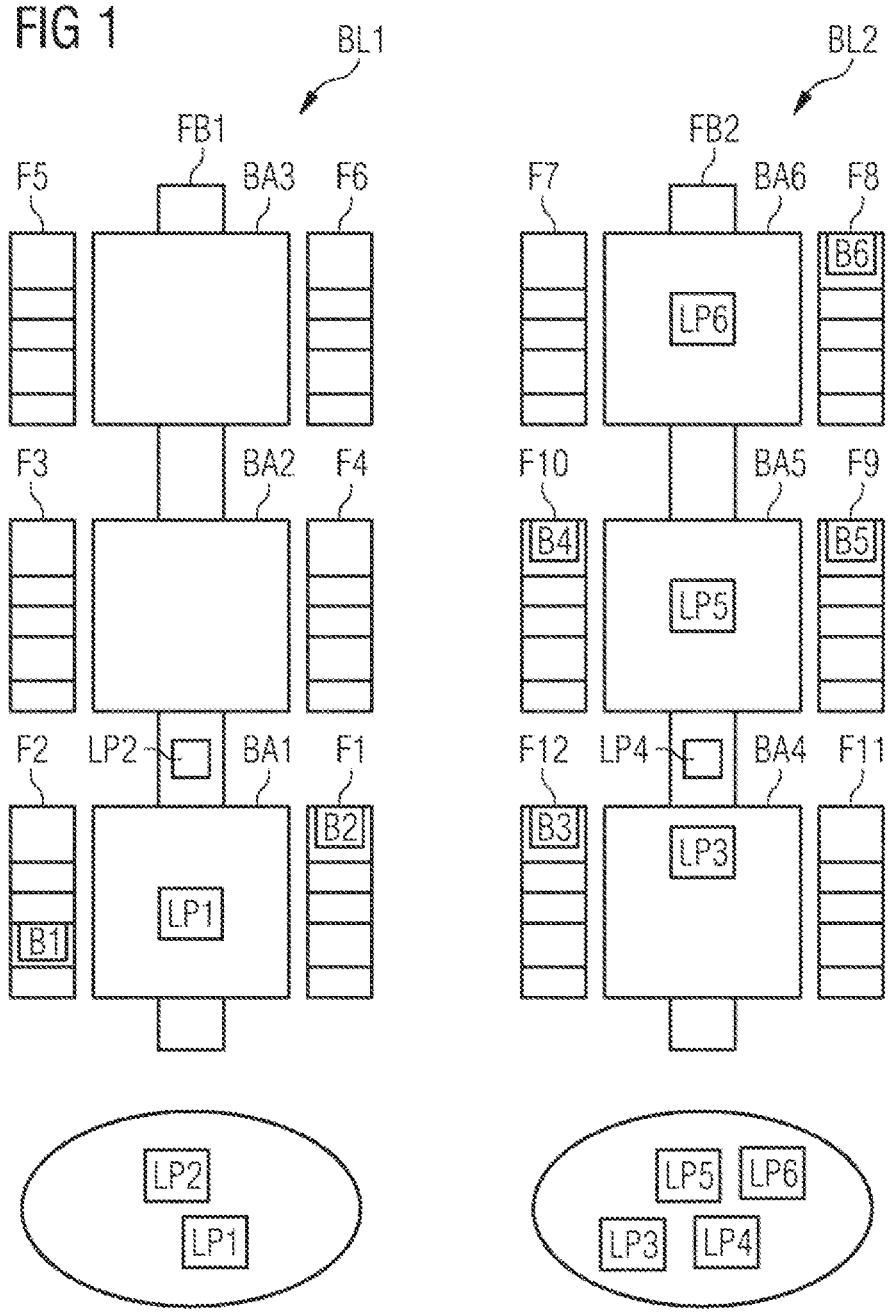
FIG. 1 shows a first exemplary assembly factory with component fitting lines for producing assemblies.

FIG. 1 shows a first exemplary assembly factory or an assembly installation with component fitting lines BL1-BL2 for producing assemblies. A component fitting line BL1-BL2 usually consists of component fitting machines BA1-BA6 that are each connected to one another by a transport system FB1-FB2 (e.g. conveyor belts) for transporting the assemblies or printed circuit boards LP1-LP6 to be fitted with components. The components or subassemblies B1-B6 to be fitted to the assemblies LP1-LP6 are usually provided on the component fitting machines BA1-BA6 by means of conveyors F1-F11. In this case, a component fitting line BL1, BL2 can be assigned multiple assemblies LP1-LP6 of a particular assembly type r from a set of assembly types $R^{(r \in R)}$.

Component fitting machines BA1-BA6 e.g. for fitting substrates with components B1-B6 have supply apparatuses F1-F11 for components B1-B6 arranged at the side on a transport path for the substrates. A component fitting head of the component fitting machine BA1-BA6, which component fitting head is movable by a positioning system, collects the components B1-B6 from the supply apparatuses F1-F11, moves them to a component fitting area of the component fitting machine in which the substrate to be fitted with components is provided, and drops the components B1-B6 on the substrate. For providing the components B1-B6, e.g. what are known as belt feeders are used, which are suitable for transporting and supplying subassemblies stored in belts. These transport the subassemblies stored in pocket-like depressions to a collection position at which the subassemblies are collected from the belt pockets by the component fitting head. The empty belt leaves the supply apparatus F1-F11 at a suitable position.

In many factories in the area of electronics production, printed circuit boards or assemblies to be produced are assigned to the SMT (surface mounting technology) component fitting lines at the respective factories in the medium term. On the basis of technical restrictions, not every printed circuit board can be produced on every line. The printed circuit boards for the most part also have different production times on the lines. Also, the maximum production time capacities of the lines cannot be exceeded.

For the assignment, the following aims are pursued:
- The number of equipment families on the lines is supposed to be as small as possible in order to reduce the conversion time outlay.
- It is desirable for as little equipment as possible (e.g. conveyors) to be needed.
- The total production time should be as minimal as possible.

Attempts are usually made to achieve these aims by virtue of the highest possible component coverage of the printed circuit boards of a line being sought, or the sum of the component variances of the lines being minimized. The component variance of a line denotes the number of component types used on the line.

The text below describes IP (IP stands for integer programming or for integer program or integer optimization model) models for this problem. The mathematical optimization method used for this problem can be IP (IP stands for integer programming or for integer program or integer optimization model) models. Such IP approaches to a solution have the following advantages:

Global optimization approach.

Easily extendable.

Very good commercial standard solvers (e.g. Cplex, Gurobi) that are widely used and proven in practice.

The standard solvers are continually being improved, which means that it can be expected that the instances will be solvable even more quickly in future.

Further, an IP-based method is presented that allows solutions to be found therefor with a very good result quality in a relatively short period.

The IP model depicted below can be regarded only as a possible exemplary formulation and is not a limitation for the method.

Let L be the set of all (component fitting) lines and R be the set of all assembly types and $R_l$ be the set of assembly types that can have components fitted on line l. Also, C is the set of component types c and $R_c$ expresses the set of assembly types with component type c.

The following parameters are used:

| | |
|---|---|
| Time Limit$_l$ | production time limit on the component fitting line l |
| $w_S$ | weighting factor for minimizing the component variance. |
| $w_V$ | weighting factor for minimizing the maximum production time variance. |

Binary variables are:

| | |
|---|---|
| Assign$_{r, l}$ | assign the assembly type r to component fitting line l |
| Setup$_{c, l}$ | use a component c on a line l (during use, it assumes the value 1, otherwise the value 0). |

In the planning period, a set of assemblies is supposed to be fitted with components of different component types on multiple SMT lines. For each assembly type r, it is estimated how many jobs there will be therefor. The actual number of items to be produced for an assembly type will arise according to a probability distribution that can be ascertained e.g. from historical data or forecasts. Using the cycle times on the various (component fitting) lines, the estimated conversion times and the levels of line use, it is possible to ascertain probability distributions for the total production times per assembly type and line, which can serve as an input. A maximum production time is also prescribed per line in the planning period. The expected production time per assembly type can be ascertained using a unit that is not depicted in the figures. Such a unit may be integrated in a component fitting machine e.g. BA1 of the component fitting line BL1. A unit, not depicted, for computing the assignment of the assemblies to component fitting lines may also be integrated in such a component fitting machine.

These units may also be implemented or integrated in a computer controlling the component fitting machines that is separate from the component fitting machines.

The aim is also to restrict production time fluctuations for the individual lines or to minimize them as far as possible.

In the exemplary embodiment, the following further parameters are used in the IP model:

| | |
|---|---|
| $n_r$ | independent random variable for the number of items n to be produced for the assembly type r within a particular period. |
| $c_r$ | fixed production time during the production of an arbitrary number of items at the assembly type r. |
| $t_{r, l}$ | cycle time for the production of an assembly of the assembly type r on line l. |
| VarMax$_l$ | maximum production time variance on the component fitting line l. |
| p | percentage for the maximum permissible differences in the production time variances on the lines. |

Continuous auxiliary variables:

| | |
|---|---|
| $V_{Max}$ | maximum production time variance on all lines. |
| $V_{Min}$ | minimum production time variance on all lines. |

It is assumed that the production time for an assembly on a line is $t_{r,l} n_r + c_r$. In this case, $c_r$ is a constant component that includes the conversion times, for example. The production times for the assembly on a line are also independent random variables.

For a set $R_l \subseteq R_l$ of assembly types r assigned to a line l, the production time is therefore also a random variable, for whose variance the following holds:

$$\text{Var}(\text{line } l \text{ production time}) = \text{Var}\left(\sum_{r \in R'_l} t_{r,l} n_r + c_r\right)$$

$$= \sum_{r \in R'_l} t_{r,l}^2 \text{Var}(n_r)$$

In an IP model, restrictions are normally used. The following restrictions of the IP model restrict the expected production time on the lines and ensure the permissibility of the solution:

$$\sum_{r \in R} EW(t_{r,l} n_r + c_r) \text{Assign}_{r,l} \leq \text{TimeLimit}_l \quad l \in L$$

The restrictions $$\text{Assign}_{r,l} = 0 \quad l \in L, r \in R \setminus R_l$$

guarantee that assemblies can be assigned only to component fitting lines on which they can also have components fitted.

The restrictions $$\sum_{l \in L} \text{Assign}_{r,l} = 1 \quad r \in R$$

assign each assembly type to precisely one component fitting line.

In the IP model, it is also possible for the production time variance of a component fitting line to be expressed as follows:

$$\text{Var}(\text{line } l \text{ production time}) = \sum_{r \in R_l} t_{r,l}^2 \text{Var}(n_r) \text{Assign}_{r,l} \quad l \in L$$

The following variants for limiting the maximum production time variance on the lines are possible:

(1) Firmly prescribed parameters $\text{VarMax}_l$ allow the production time variances for all lines l to be limited by the additional restrictions $$\sum_{r \in R_l} t_{r,l}^2 \text{Var}(n_r) \text{Assign}_{r,l} \leq \text{VarMax}_l \quad l \in L$$

(2) Using an auxiliary variable $V_{max}$ and additional restrictions $$\sum_{r \in R_l} t_{r,l}^2 \text{Var}(n_r) \text{Assign}_{r,l} \leq V_{max} \quad l \in L$$

it is possible to minimize $V_{max}$ to achieve the effect that the maximum production time variance of the lines is minimized as far as possible. $V_{max}$ can be included in the target function of the IP model in this case with a weight factor $w_v$.
(3) A further option is for the difference in the maximum and minimum variances of the lines to be restricted for a prescribed percentage p.
In this regard, let $V_{min}$ be a further auxiliary variable. Additional restrictions are $$V_{min} \leq \sum_{r \in R_l} t_{r,l}^2 \text{Var}(n_r) \text{Assign}_{r,l} \quad l \in L$$

and $$V_{max} - V_{min} \leq \frac{p}{100} V_{max}$$

The restrictions depicted above for the variants (1) and (3) can also each be used to extend the IP model from DE 10 2011 076 565 B4, WO2014/005741 A1, WO2014/005743 A1, WO2014/005744 A1. The methods known from the cited documents are examples of optimization methods by means of MIP for assignments of assemblies to component fitting lines.

Accordingly, production time fluctuations can be limited in these IP models too. Variant (2) can likewise be used to extend these IP models by virtue of $V_{max}$, in addition to the new restrictions, also being included in the target function with a chosen weighting.

The integer linear programming can be solved by the following steps:
a) ascertaining a starting solution or first current solution,
b) assigning a selected set of assemblies LP1-L6 to the component fitting lines BL1-BL2, based on a current solution,
c) computing the new assignments by means of an optimization program or a standard solver based on integer linear programming.

The steps can be performed iteratively and a program termination takes place if a previously stipulated time limit or result quality is reached.

The following variants of the extended IP formulation are possible:
IP formulation for the variant (1):

$$\text{minimize} \sum_{c \in C} \sum_{l \in L} \text{Setup}_{c,l}$$

Under the conditions:

$$\sum_{l \in L} \text{Assign}_{r,l} = 1 \qquad r \in R$$

$$\text{Assign}_{r,l} = 0 \qquad l \in L, r \in R \land r \notin R_l$$

$$\sum_{r \in R_c} \text{Assign}_{r,l} \leq |R_c| \text{Setup}_{c,l} \qquad c \in C, l \in L$$

$$\sum_{r \in R} EW(t_{r,l} n_r + c_r) \text{Assign}_{r,l} \leq \text{TimeLimit}_l \qquad r \in R$$

$$\sum_{r \in R_l} t_{r,l}^2 \text{Var}(n_r) \text{Assign}_{r,l} \leq \text{VarMax}_l \qquad l \in L$$

$$\text{Setup}_{c,l} \in \{0, 1\} \qquad c \in C, l \in L$$

$$\text{Assign}_{r,l} \in \{0, 1\} \qquad r \in R, l \in L$$

and IP formulation for variants (2) and (3):

$$\text{minimize } w_v V_{Max} + w_s \sum_{c \in C} \sum_{l \in L} \text{Setup}_{c,l}$$

Under the conditions:

$$\sum_{l \in L} \text{Assign}_{r,l} = 1 \qquad r \in R$$

$$\text{Assign}_{r,l} = 0 \qquad l \in L, r \in R \setminus R_l$$

$$\sum_{r \in R_c} \text{Assign}_{r,l} \leq |R_c| \text{Setup}_{c,l} \qquad c \in C, l \in L$$

$$\sum_{r \in R} EW(t_{r,l} n_r + c_r) \text{Assign}_{r,l} \leq \text{TimeLimit}_l \qquad r \in R$$

$$\sum_{r \in R_l} t_{r,l}^2 \text{Var}(n_r) \text{Assign}_{r,l} \leq V_{Max} \qquad l \in L$$

$$\sum_{r \in R_l} t_{r,l}^2 \text{Var}(n_r) \text{Assign}_{r,l} \geq V_{Min} \qquad l \in L$$

$$V_{Max} - V_{Min} \leq \frac{p}{100} V_{Max} \qquad l \in L$$

$$\text{Setup}_{c,l} \in \{0, 1\} \qquad c \in C, l \in L$$

$$\text{Assign}_{r,l} \in \{0, 1\} \qquad r \in R, l \in L$$

$$V_{Max} \geq 0$$

$$V_{Min} \geq 0$$

The text below explains a simplified example intended to explain the optimization process, depicted in complex fashion above, for the minimization of the component variance under the restriction of production time fluctuations in a simplified manner for comprehension, without being restricted to this simplified example. If the simple example with few instances described below is transferred to larger instances or more complex problems, a good or precise selection of parameters in the IP model with the restrictions to be applied or the user-defined presets is fundamental in order to be able to attain a solution to the complex problem with the aforementioned standard solvers in the first place or in optimized fashion.

In the example below, it is assumed that, for an assembly type given a forecast number of items of n, the number of items actually to be produced or have components fitted fluctuates according to the following probability distribution:

the forecast value n is assumed with a probability of 0.8. a 10% difference in the value n at the top or bottom is assumed with a probability of 0.1 in each case.

Six different assembly types are supposed to be assigned to two lines BL1 and BL2. The forecast numbers of items n are:

| r1 | r2 | r3 | r4 | r5 | r6 |
|---|---|---|---|---|---|
| 2000 | 2000 | 1000 | 1000 | 1000 | 1000 |

The assembly types are supposed to be fitted with the component types c1-c9 according to the following table:

|    | c1 | c2 | c3 | c4 | c5 | c6 | c7 | c8 | c9 |
|----|----|----|----|----|----|----|----|----|----|
| r1 | X  | X  |    |    |    |    |    |    |    |
| r2 |    | X  | X  |    |    |    |    |    |    |
| r3 |    |    |    | X  | X  |    |    |    |    |
| r4 |    |    |    | X  | X  | X  |    |    |    |
| r5 |    |    |    |    |    |    | X  | X  |    |
| r6 |    |    |    |    |    |    |    | X  | X  |

The assignment is supposed to be made such that the two lines have the same utilization level, i.e. have the same expected production times. The cycle times are 1 min for all assembly types, and therefore e.g. the production time is 1000 min when the number of items is 1000.

Figure 2:
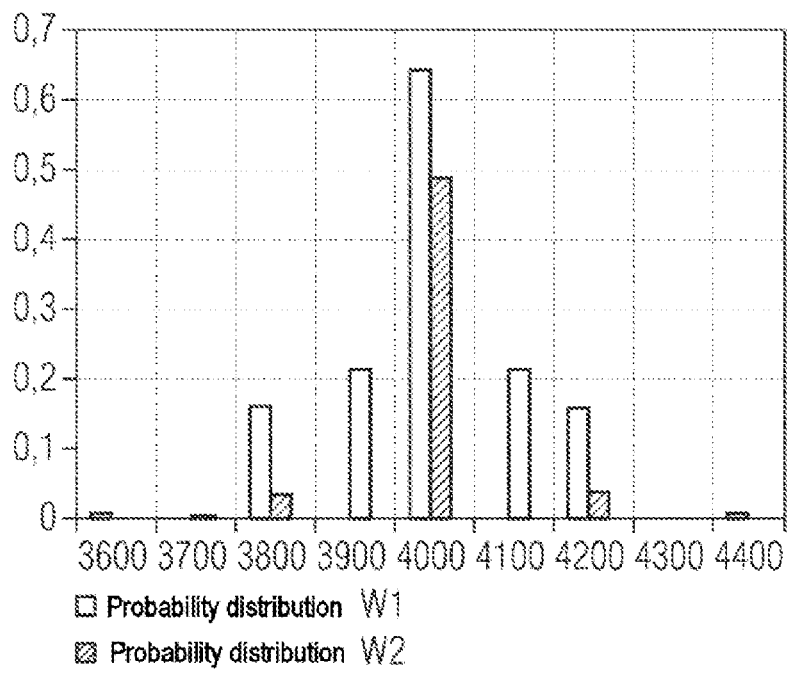
FIG. 2 shows a graph of the probability distributions for the numbers of items/production times of lines 1 and 2 for an assembly line assignment.

If the target criterion is minimization of the component variance, then r1 and r2 are assigned to the line BL1 and the assemblies r3 to r6 are assigned to the line BL2, since this means that the component types c1-c3 are needed on the line BL1 and the component types c4-c9 are needed on the line BL2 and a minimum component variance of 9 is obtained overall. The following probability distributions W1 and W2 for the numbers of items/production times on the two lines BL1 and BL2 are thus obtained, as depicted in the table below and in FIG. 2.

|      | Probability distribution of BL1 | Probability distribution of BL2 |
|------|----|----|
| 3600 | 0.01 | 0.0001 |
| 3700 |      | 0.0032 |
| 3800 | 0.16 | 0.0388 |
| 3900 |      | 0.2144 |
| 4000 | 0.64 | 0.487 |
| 4100 |      | 0.2144 |
| 4200 | 0.16 | 0.0388 |
| 4300 |      | 0.0032 |
| 4400 | 0.01 | 0.0001 |

On line BL1, the two assembly types with large numbers of items mean that a large range of fluctuation is obtained for the numbers of items/production times.

The variance for the production time on the line BL1 is at a maximum and is:

$$2*(400^2*0.01+200^2*0.16)=16\ 000$$

If the variances for the production times are additionally restricted to 12 000 on all lines by the restrictions listed in (1), then the assembly types r1, r3 and r4 are assigned to the line BL1 and the assembly types r2, r5 and r6 are assigned to the line BL2.

Figure 3:
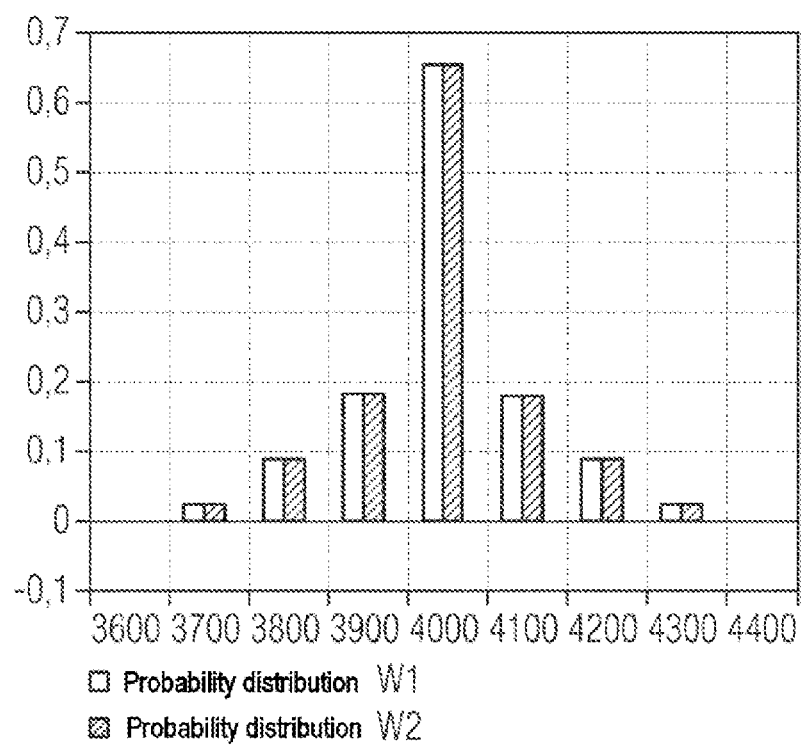
FIG. 3 shows a graph of said probability distributions based on the optimization approach according to embodiments of the invention for an assembly line assignment.

Thus, the following probability distributions W1 and W2 for the numbers of items/production times on the two lines BL1 and BL2 are obtained, as depicted in the table below and in FIG. 3.

|      | Probability distribution of BL1 | Probability distribution of BL2 |
|------|----|----|
| 3600 | 0.001 | 0.001 |
| 3700 | 0.016 | 0.016 |
| 3800 | 0.074 | 0.074 |
| 3900 | 0.144 | 0.144 |
| 4000 | 0.53  | 0.53  |
| 4100 | 0.144 | 0.144 |
| 4200 | 0.074 | 0.074 |
| 4300 | 0.016 | 0.016 |
| 4400 | 0.001 | 0.001 |

The maximum variance for the production times decreases by 25% in the case of this second assignment to $$2*(400^2*0.001+300^2*0.016+200^2*0.074+100^2*0.144)=12\ 000$$

In the middle and at the edge, the values of the distributions for line BL1 and line BL2 in the case of the second assignment of lines for assemblies are much lower than the values of the distribution for line BL1 in the case of the first assignment of lines for assemblies. At the edge, the probability is even now only a tenth.

In the case of the second assignment, the component types c1-c2 and c4-c6 are needed on the line BL1 and the component types c2-c3 and c7-c9 are needed on the line BL2. All in all, a component variance of 10 is therefore obtained.

In comparison with the first assignment, the sum of component types needed on the lines has only increased from 9 to 10, whereas the maximum variance for the production times on the lines has decreased significantly from 16 000 to 12 000.

Given a suitable choice of parameters, it is specifically possible for the second assignment of lines for assemblies explained above to be ascertained. The steps of the optimization can be performed iteratively and a program termination can take place effected if a previously stipulated time limit or a prescribable result quality is reached.

Although the invention has been illustrated and described in greater detail with reference to the preferred exemplary embodiment, the invention is not limited to the examples disclosed, and further variations can be inferred by a person skilled in the art, without departing from the scope of protection of the invention.

For the sake of clarity, it is to be understood that the use of "a" or "an" throughout this application does not exclude a plurality, and "comprising" does not exclude other steps or elements.

The invention claimed is:

1. A method for assigning assemblies to component fitting lines for fitting the assemblies with components in order to achieve a minimal component variance for prescribed maximum utilization levels over time per component fitting line, wherein the component variance is determined as a sum of a number of component types needed on the component fitting lines, wherein an expected production time is ascertained for each assembly type of the assemblies to be fitted with components and each component fitting line taking into consideration a respective cycle time for the assembly type on the component fitting line, respective conversion times, a respective level of line use and an expected number of items to be produced per assembly type, wherein an actual number of items to be produced arises according to a previously determinable probability distribution, wherein a sum of these expected total production times must not exceed the maximum utilization level of the respective component fitting line over time for the set of assemblies that is assigned to a line, wherein possible assignments of assemblies to the component fitting lines are limited by existing infrastructure or by user-defined presets, wherein the assignment is made such that for the probability distributions for a sum of the expected production times per component fitting line that result from the probability distributions, the differences from the respective expected value of these resultant probability distributions are limited by a prescribable maximum difference, wherein the assignment of the assemblies to the component fitting lines is computed for the given presets by integer linear programming.

2. The method as claimed in claim 1, wherein the sum of the expected production times of the component fitting lines is minimized by integer linear programming.

3. The method as claimed in claim 1, wherein the cited differences from the expected values of the resultant probability distributions assume similar values.

4. The method as claimed in claim 1, wherein a difference from the sum of the expected production times of a component fitting line is expressed as a variance thereof.

5. The method as claimed in claim 1, wherein a weighted sum consisting of the component variance and the maximum difference from the sum of the expected production times is minimized.

6. The method as claimed in claim 1, wherein user-prescribed sets of assemblies are assigned to the same component fitting line.

7. The method as claimed in claim 1, wherein the input data used for the integer linear programming are the following data describing the infrastructure:
    number of component fitting lines,
    number of assemblies,
    number of assembly types,
    number of component types,
    set of component types to be fitted per assembly type,
        production time limit per respective component fitting line
        probability distributions for the expected numbers of items of the assembly types.

8. The method as claimed in claim 1, wherein the total production time for a respective assembly type on a respective component fitting line is computed from:
    the number of jobs to be expected,
    the batch sizes,
    the conversion times,
        the individual production times per assembly and component fitting line,
        minimum cycle times of the component fitting lines,
        levels of use of the component fitting lines.

9. The method as claimed in claim 1, wherein the integer linear programming is set by an integer linear program solved by the following steps:
    a) ascertaining a first current solution representing an assignment of assemblies to production lines,
    b) assigning a selected set of assemblies to the component fitting lines, based on a current solution,
    c) computing the new assignments by means of an optimization program or a standard solver based on integer linear programming.

10. The method as claimed in claim 9, wherein the steps are performed iteratively and a program termination takes place if a previously stipulated time limit or solution quality has been reached.

11. An apparatus for assigning assemblies to component fitting lines for fitting the assemblies with components, having:
    a unit for ascertaining an expected production time for each assembly type of the assemblies to be fitted with components and for each component fitting line taking into consideration a respective cycle time for the assembly type on the component fitting line and an expected number of items to be produced per assembly type, wherein an actual number of items to be produced can arise according to a previously determinable probability distribution, wherein a sum of these expected total production times must not exceed the maximum utilization level of the respective component fitting line over time for a set of assemblies that is assigned to a line, wherein possible assignments of assemblies to component fitting lines can be limited by existing infrastructure and/or by user-defined presets and wherein a component variance is determinable as a sum of a number of component types needed on the component fitting lines in order to achieve a minimum component variance for prescribed maximum utilization levels over time per component fitting line, and
    a unit for computing the assignment of the assemblies to the component fitting lines for the given presets by means of integer linear programming, wherein the computation of the assignment is effected such that for the probability distributions for a sum of expected production times per component fitting line that result from the probability distributions, the differences from the respective expected value of these resultant probability distributions are limitable by a prescribable maximum difference.

12. The apparatus as claimed in claim 11, wherein the cited differences from the expected values of the resultant probability distributions can assume similar or like values.

13. The apparatus as claimed in claim 11, wherein a difference from the sum of the expected production times of a component fitting line can be expressed as a variance thereof.

14. The apparatus as claimed in claim 11, wherein a weighted sum consisting of the component variance and the maximum difference from the sum of the expected production times is minimizable.

15. The apparatus as claimed in claim 11, wherein user-prescribed sets of assemblies can be assigned to the same component fitting line.

16. A production or assembly line arrangement for fitting assemblies with components, wherein the assignment of the assemblies to the production or assembly line is determinable according to claim 1.

17. The apparatus of claim 11, further comprising, a computer program having means for performing the ascertaining and computing steps when the computer program is executed on the apparatus or in means of the apparatus.

18. A computer program product, comprising a computer readable storage device storing a computer readable program code, the computer readable program code comprising program commands for the purposes of executing the method as claimed in claim 1.

* * * * *